(12) United States Patent
Iguelmamene

(10) Patent No.: US 9,806,700 B2
(45) Date of Patent: Oct. 31, 2017

(54) INPUT RECEIVER WITH MULTIPLE HYSTERESIS LEVELS

(71) Applicant: SanDisk Technologies Inc., Plano, TX (US)

(72) Inventor: Lakhdar Iguelmamene, San Jose, CA (US)

(73) Assignee: SanDisk Technologies LLC, Plano, TX (US)

( * ) Notice: Subject to any disclaimer, the term of this patent is extended or adjusted under 35 U.S.C. 154(b) by 116 days.

(21) Appl. No.: 14/261,943

(22) Filed: Apr. 25, 2014

(65) Prior Publication Data

US 2015/0188523 A1    Jul. 2, 2015

Related U.S. Application Data

(60) Provisional application No. 61/921,637, filed on Dec. 30, 2013.

(51) Int. Cl.
| | | |
|---|---|---|
| H03K 3/00 | (2006.01) | |
| H03K 3/3565 | (2006.01) | |
| H03K 3/013 | (2006.01) | |
| H03K 3/012 | (2006.01) | |
| H03K 5/1252 | (2006.01) | |

(52) U.S. Cl.
CPC .......... *H03K 3/3565* (2013.01); *H03K 3/012* (2013.01); *H03K 3/013* (2013.01); *H03K 5/1252* (2013.01)

(58) Field of Classification Search
CPC .. H01J 65/048; H01J 61/56; H01L 2924/0002
See application file for complete search history.

(56) References Cited

U.S. PATENT DOCUMENTS

| | | | |
|---|---|---|---|
| 6,353,346 B1 * | 3/2002 | Chan ................... | H03K 3/3565 327/112 |
| 6,870,413 B1 | 3/2005 | Chang et al. | |
| 7,812,639 B2 | 10/2010 | Lai et al. | |
| 7,888,966 B1 | 2/2011 | Davidson et al. | |
| 2006/0017482 A1 * | 1/2006 | Chauhan ............. | H03K 3/3565 327/205 |
| 2012/0108252 A1 * | 5/2012 | Dimou ................. | H04W 36/32 455/450 |
| 2013/0222032 A1 * | 8/2013 | Chou ................... | H03K 3/3565 327/205 |

FOREIGN PATENT DOCUMENTS

| | | |
|---|---|---|
| WO | WO 2009/088695 A2 | 7/2009 |
| WO | WO 2013/130318 A1 | 9/2013 |

OTHER PUBLICATIONS

Cockrill, Chris, "Understanding Schmitt Triggers," *Texas Instruments*, Application Report SCEA046—Sep. 2011, 5 pp.

(Continued)

*Primary Examiner* — Sibin Chen
(74) *Attorney, Agent, or Firm* — Brinks Gilson & Lione

(57) ABSTRACT

An integrated circuit ("IC") includes an input receiver with multiple hysteresis levels. An exemplary input receiver may be an input buffer with a Schmitt trigger that has multiple hysteresis windows between different high and low input voltages. This circuit may improve the input noise immunity of the external input signals and timing by allowing for a selection one of the plurality of levels depending on parameters of the input (e.g. noise level).

20 Claims, 5 Drawing Sheets

(56) References Cited

OTHER PUBLICATIONS

International Search Report and Written Opinion of the International Searching Authority dated Feb. 12, 2015 for PCT Application No. PCT/US2014/066659 (10 pp.).
International Preliminary Report on Patentability and Written Opinion issued Jul. 5, 2016 for PCT Application No. PCT/US2014/066659 (8 pp.).

* cited by examiner

FIG. 6 is a flow chart illustrating operation of a multiple hysteresis input receiver circuit.

INPUT RECEIVER WITH MULTIPLE HYSTERESIS LEVELS

PRIORITY

This application claims priority to Provisional Patent Application Ser. No. 61/921,637, filed on Dec. 30, 2013, entitled "INPUT RECEIVER WITH MULTIPLE HYSTERESIS LEVELS", the entire disclosure of which is herein incorporated by reference.

TECHNICAL FIELD

This application relates to a circuit with an input receiver with multiple hysteresis levels.

BACKGROUND

CMOS or NMOS devices may utilize fast edges on the high and low transitions on their inputs. If the edges are too slow (e.g. at start-up) they may cause excessive current and oscillation. An input receiver may switch at the same point on the rising edge and falling edge. When the switch occurs it may require current from the input, which may cause the input voltage to drop resulting in shift. Likewise, oscillation may also be caused by noise on the input. A Schmitt trigger type input receiver device may shift the slow/noisy edges to be faster edges. Schmitt trigger circuit design is used in the digital and analog integrated circuit ("IC") designs to reduce and improve the noise immunity of the input receivers. A Schmitt trigger design may have a hysteresis window which is the difference between the input high voltage and the input low voltage.

SUMMARY

It may be desirable to increase the number of hysteresis levels or windows for an input receiver (i.e. input buffer) in an integrated circuit ("IC"). There may be multiple input high voltages and input low voltages (e.g. 1, 2, 3 . . . ) to correspond with the each of the hysteresis levels. An exemplary input receiver may be an input buffer with a Schmitt trigger that has multiple hysteresis windows between the different high and low input voltages. This circuit may improve the input noise immunity of the external input signals and timing by selecting one of the plurality of levels depending on the input (e.g. noise level). The different levels may be selected depending on whether the design is for a low speed or high speed and the corresponding noise level. This may allow for better signaling and improving timing (from input to output) as well as reducing and eliminating input noise. Further, this circuit may also eliminate and reduce internal glitching by setting the correct hysteresis window depending on the interface.

DETAILED DESCRIPTION

Figure 1:
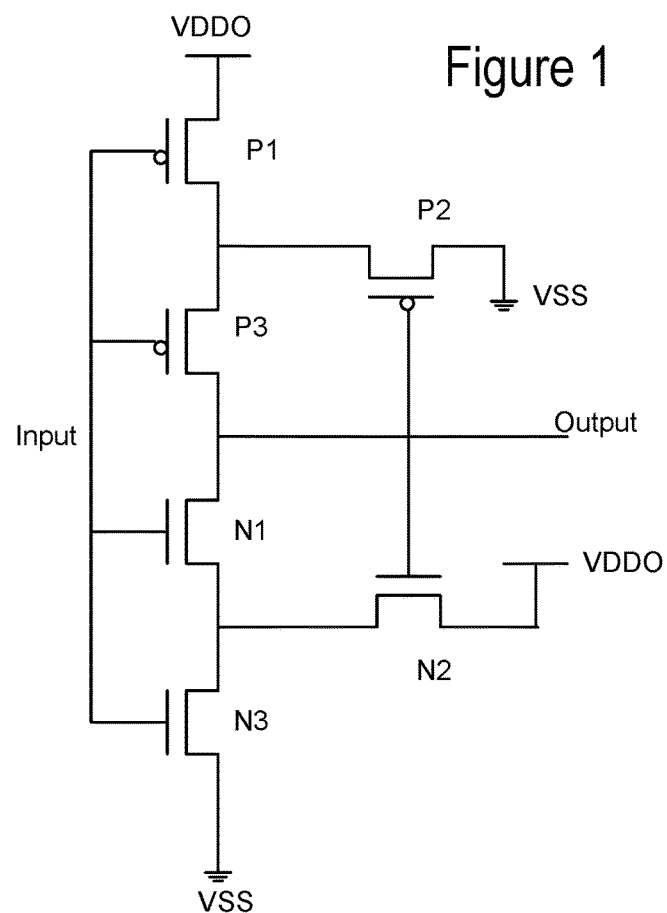
FIG. 1 is a Schmitt trigger.
Figure 2:
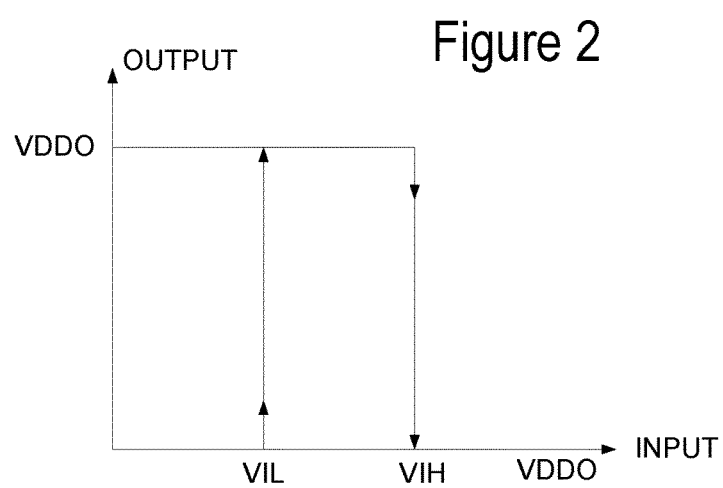
FIG. 2 is a chart displaying a hysteresis window for the trigger in FIG. 1.

FIGS. 1 and 2 illustrate a Schmitt trigger and an exemplary hysteresis level. FIGS. 3-6 illustrate embodiments with multiple hysteresis levels. FIG. 1 is a Schmitt trigger with a single hysteresis level or window. The power supply VDDO is provided. $V_{ss}$, is the supply voltage. FIG. 1 illustrates a total of six devices or transistors P1-P3 and N1-N3 arranged as a Schmitt trigger. P1-P3 (PMOS transistors), N1-N3 (NMOS transistors) are the input receiver's PMOS and NMOS transistors. P2 and N2 are the transistors generating one level (window) hysteresis. The input buffer with Schmitt trigger receives the input signal from the input/output ("IO") which may be an external signal. The input buffer eliminates or reduces the input noise associated with the signal. As shown in FIG. 1, the P2 and N2 transistors generate one level hysteresis. The sizing and optimizing of the P2 and N2 transistors fixes the hysteresis level to one level and is output.

Schmitt trigger devices may be used in signal conditioning applications to remove noise from input signals in digital circuits, or in closed loop negative feedback configurations to implement relaxation oscillators, used in function generators and switching power supplies. As described a Schmitt trigger may be a comparator circuit with hysteresis, implemented by applying positive feedback to an input of a comparator or differential amplifier. It may be a circuit which converts an analog input signal to a digital output signal. The output may retain its value until the input changes sufficiently to trigger a change. When the input is higher than a threshold, the output is high. When the input is below a lower threshold, the output is low. When the input is between the two levels, the output retains its value. The value between the thresholds is hysteresis.

FIG. 2 is a chart illustrating a hysteresis level for the trigger in FIG. 1. The Schmitt trigger in FIG. 1 results in an input low voltage ("VIL") and an input high voltage ("VIH"). VIL and VIH are the input level threshold where VIL is the input low threshold and VIH is the input high threshold. In other words, VIL is the needed input voltage from high to low levels to change the output voltage and VIH is the needed input voltage from low to high level to change the output voltage. FIG. 2 illustrates that the single hysteresis window is between VIH and VIL.

Figure 3:
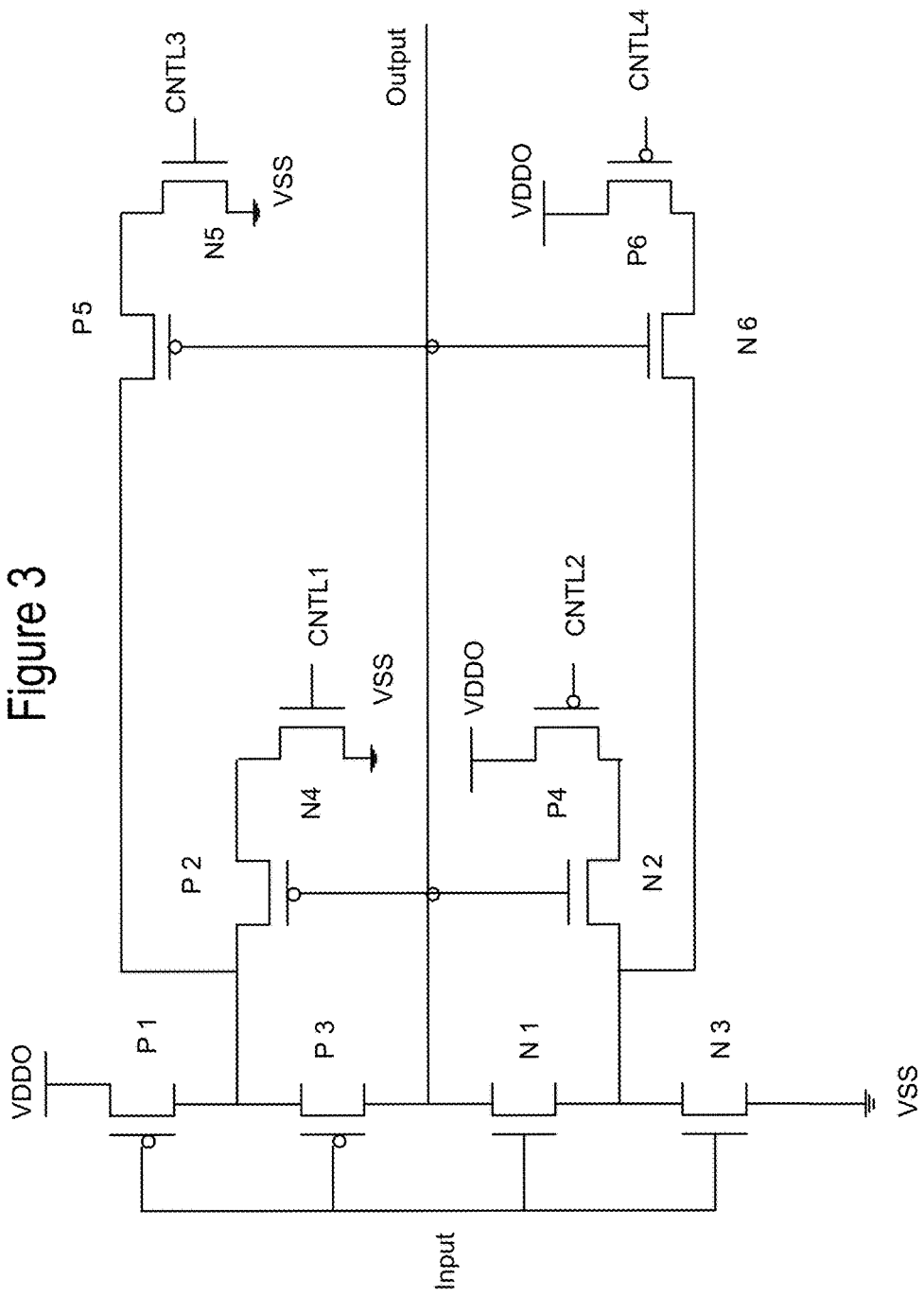
FIG. 3 is a circuit of an input buffer hysteresis window having three levels.
Figure 4:
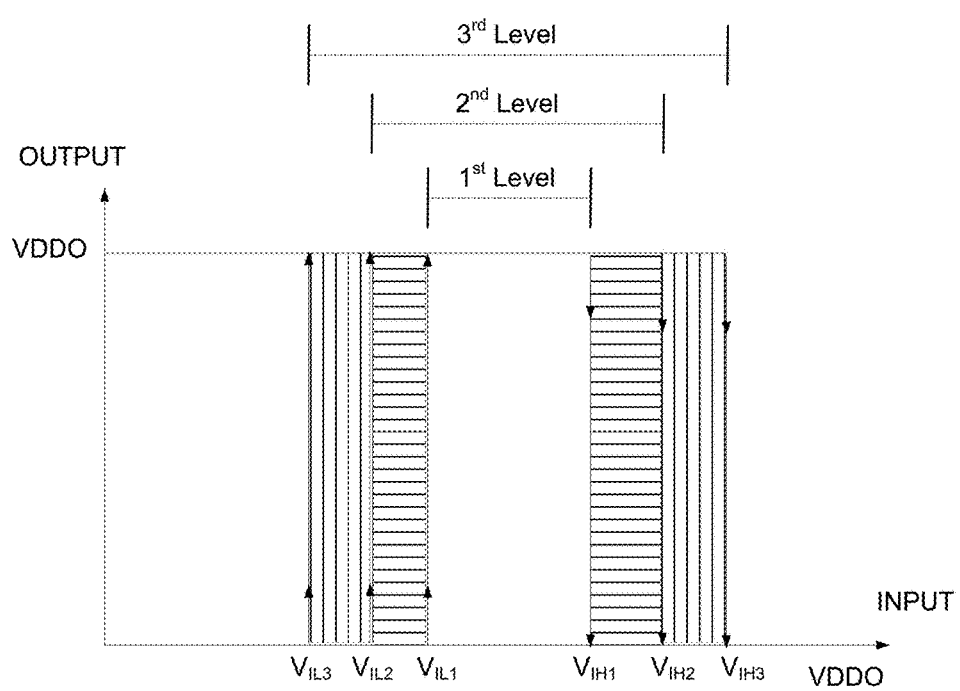
FIG. 4 is a chart displaying multiple hysteresis windows from the circuit in FIG. 3.

FIG. 3 is a circuit of an input buffer hysteresis window having three levels. FIG. 3 illustrates a power supply VDDO and supply voltage $V_{ss}$. VDDO is the input receiver's power supply. $V_{SS}$ is the input receiver's ground. There are 12 transistors N1-N6 and P1-P6 along with four control signals CNTL1-CNTL4. The additional of the P5 and N6 transistors with additional controls CNTL3 and CNTL4 results in three hysteresis levels as shown in FIG. 4. CNTL1 and CNTL2 are generated from the same source one bit control but they are opposite polarity. Likewise, CNTL3 and CNTL4 are generated from the same source one bit control but they are opposite polarity.

FIG. 4 is a chart displaying multiple hysteresis windows/levels from the circuit in FIG. 3. Each hysteresis level is a difference between a pair of input high voltage and input low voltage. Accordingly, there are three pairs (corresponding to three levels) of input high and input low voltages. The first level (VIL1 to VIH1) is controlled by transistors N2 and P2 with their respective controls CNTL1 and CNTL2 when both CNTL3 and CNTL4 are off. The second level (VIL2 to VIH2) is controlled by transistors P5 and N6 with their respective controls CNTL3 and CNTL4 when both CNTL1 and CNTL2 are off. The third level is the combination of both windows with CNTL1 and CNTL2, as well as CNTL3 and CNTL4 still on.

The first level of hysteresis (CNTL1 and CNTL2 on; CNTL3 and CNTL4 off) is shown as the smallest narrowest window of hysteresis. In one embodiment, the smaller hysteresis may be used for high speed inputs with smaller noise levels. For higher speed the input receiver may need to be toggled fast and may require very small or no hysteresis because the hysteresis will impact the high speed signal. The hysteresis may cause a malfunction of the input receiver at high speed, so the high speed is better with small or no hysteresis.

The second level of hysteresis (CNTL3 and CNTL4 on; CNTL1 and CNTL2 off) is shown as an intermediate or medium level that larger than the first level, but smaller than the third level. The second level is illustrated with horizontal fill lines in the portion of the hysteresis window that is larger than the first hysteresis window. The second level hysteresis may be used for medium to high speed inputs with moderate noise levels.

The third level of hysteresis (CNTL1 and CNTL2 on; CNTL3 and CNTL4 on) is shown as a larger level that is bigger than both the first and second levels. The third level is illustrated with vertical fill lines in the portion of the hysteresis window that is larger than the second (and first) hysteresis window. The third level hysteresis may be used for a low speed input signal with higher noise levels. Low speed inputs may have higher noise because the traces on the PCB and the manufacturing may be lower cost. The system may not be optimized and may have signal reflections that may cause malfunction.

Figure 5:
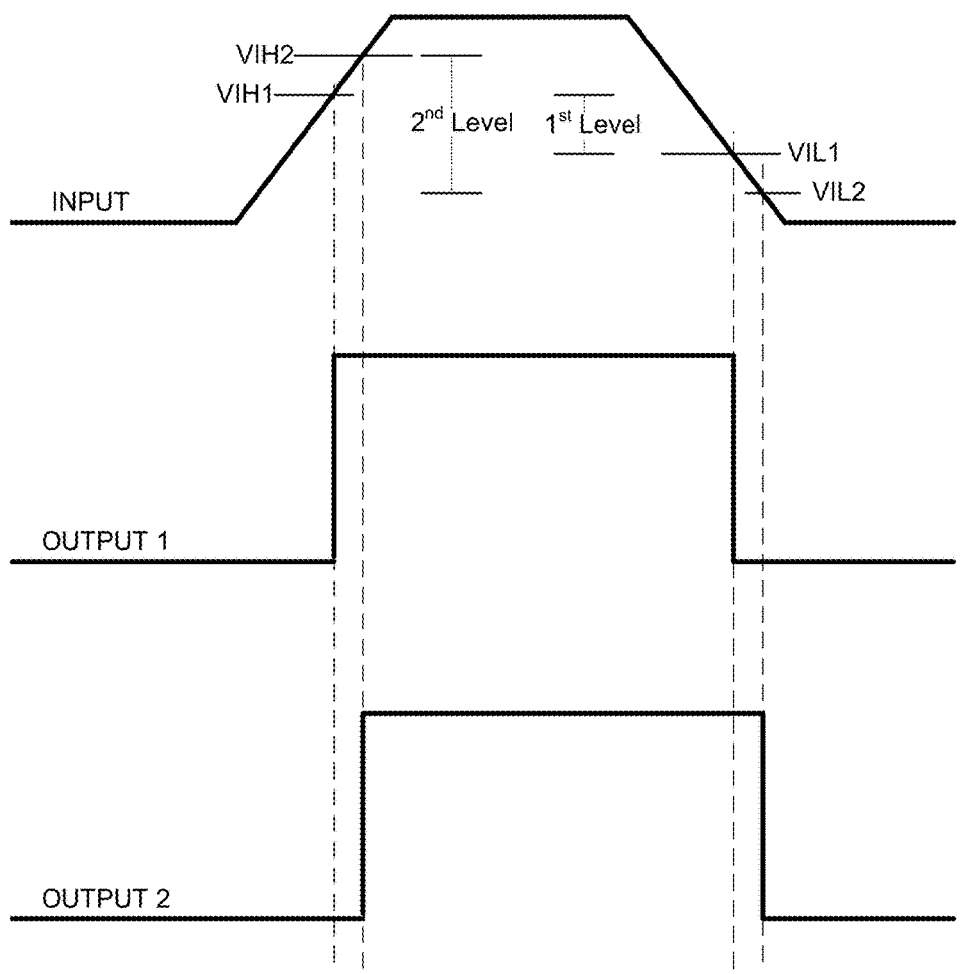
FIG. 5 is an alternative chart displaying inputs from a circuit utilizing a hysteresis window with two levels.

In alternative embodiments, the circuit may establish any number of hysteresis levels. For example, FIG. 5 illustrates outputs for two hysteresis levels. Alternatively, additional transistors may be added to the input buffer circuit to generate additional pairs of input high voltage and input low voltage (hysteresis levels) that can be controlled through additional control signals. The use of more hysteresis levels can provide a more flexible circuit that can handle and be sensitive to inputs with varying noise levels while still having better signaling and timing from input to output. Different interfaces (with varying inputs) may require or be optimized with different hysteresis levels. The more devices/transistors that are present in the circuit, the load increases and may decrease efficiency.

FIG. 5 is an alternative chart displaying inputs from a circuit utilizing a hysteresis window with two levels. In one embodiment, the circuit in FIG. 3 may be utilized with two of the three hysteresis levels. In other words, any combination of two of the three hysteresis levels may be used together to establish a circuit with two hysteresis levels. For example, the second level hysteresis may not be utilized (i.e. CNTL1 and CNTL2 are always on).

FIG. 5 illustrates an input and the two outputs (OUTPUT1, OUTPUT2) at the different levels. The first level of hysteresis is smaller than the second level of hysteresis because (VIH2-VIL2)>(VIH1-VIL1). When the input crosses above the high input voltage, then the output rises. Likewise, when the input crosses below the low input voltage, the output drops. Although the output rise and fall are illustrated as straight for simplicity, the transition may actually be slightly gradual. Assuming that the example in FIG. 5 does not use the third level hysteresis (from FIGS. 3-4), then OUTPUT1 illustrates the example where CNTL1 and CNTL2 are on, but CNTL3 and CNTL4 are off. Conversely, OUTPUT2 illustrates the example where CNTL3 and CNTL4 are on, but CNTL1 and CNTL2 are off.

Figure 6:
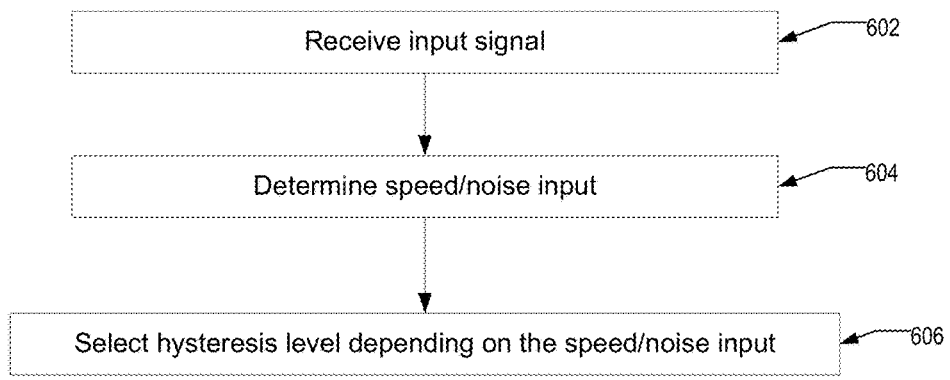

FIG. 6 is a flow chart illustrating operation of a multiple hysteresis input receiver circuit. In block 602, an input signal is received. The input signal is analyzed and a speed/noise of the input signal is determined in block 604. The speed may be determined because the frequency may be predetermined by the interface (i.e. fixed speed). Alternatively, the speed may be variable and the devices may negotiate the interface speed and setup the optimum operating speed to satisfy the different parameters of the interface.

The circuit design with multiple hysteresis windows/levels may handle both low speed and high speed designs because the hysteresis level can be selected accordingly. A slower system may have higher noise, so the larger hysteresis window may be utilized to eliminate the higher noise. Conversely, a high speed system may have lower noise, so the larger hysteresis window is not necessary. In block 606, the hysteresis window/level may be selected depending on the determined speed/noise of the input. As discussed above, the selection of the hysteresis window includes utilizing the appropriate control signals. In particular, the faster speed systems have lower noise, so the smaller hysteresis windows/levels may be selected, whereas the slower systems have higher noise and would require the larger hysteresis windows/levels to be selected to properly reduce/eliminate that noise. At higher speeds, a smaller hysteresis is preferable so that the switching is more accurate. This may be due to the frequency of the input so that the timing and signaling remain accurate.

A "computer-readable medium," "machine readable medium," "propagated-signal" medium, and/or "signal-bearing medium" may comprise any device that includes, stores, communicates, propagates, or transports software for use by or in connection with an instruction executable system, apparatus, or device. The machine-readable medium may selectively be, but not limited to, an electronic, magnetic, optical, electromagnetic, infrared, or semiconductor system, apparatus, device, or propagation medium. A non-exhaustive list of examples of a machine-readable medium would include: an electrical connection "electronic" having one or more wires, a portable magnetic or optical disk, a volatile memory such as a Random Access Memory "RAM", a Read-Only Memory "ROM", an Erasable Programmable Read-Only Memory (EPROM or Flash memory), or an optical fiber. A machine-readable medium may also include a tangible medium upon which software is printed, as the software may be electronically stored as an image or in another format (e.g., through an optical scan), then compiled, and/or interpreted or otherwise processed. The processed medium may then be stored in a computer and/or machine memory.

In an alternative embodiment, dedicated hardware implementations, such as application specific integrated circuits, programmable logic arrays and other hardware devices, can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit.

Accordingly, the present system encompasses software, firmware, and hardware implementations.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

I claim:

1. A method comprising:
receiving an input signal;
identifying a speed level and a noise level of a device providing the input signal; and
selecting one of multiple hysteresis levels through a plurality of control signals and transistors, wherein such selection includes an input high voltage and an input low voltage, wherein higher speed and lower noise inputs utilize a smaller hysteresis level with a lower input high voltage and a higher input low voltage, further wherein lower speed and higher noise inputs utilize a larger hysteresis level with a higher input high voltage and a lower input low voltage;
wherein at least a pair of the control signals is coupled with at least a pair of the transistors to control only a power signal and at least another pair of the control signals is coupled with another pair of transistors to control only a ground, further wherein the control signals control corresponding transistors to establish the multiple hysteresis windows.

2. The method of claim 1 wherein the multiple hysteresis levels comprises two hysteresis levels including a smaller hysteresis window with the lower input high voltage and the higher input low voltage and a larger hysteresis window with the higher input high voltage and the lower input low voltage.

3. The method of claim 2 wherein the selecting further comprises:
selecting the smaller hysteresis window when a higher speed is identified; and
selecting the larger hysteresis window when a lower speed is identified.

4. The method of claim 2 wherein the selecting further comprises:
selecting the smaller hysteresis window when a lower noise level is identified; and
selecting the larger hysteresis window when a higher noise level is identified.

5. The method of claim 1 wherein the identifying comprises selecting control signals from the circuit.

6. The method of claim 1 wherein the circuit comprises a Schmitt trigger with multiple hysteresis levels.

7. The method of claim 1 wherein the input high voltage comprises an input voltage threshold when an output switches from a low level to a high level and the input low voltage comprises an input voltage threshold when an output switches from a high level to a low level.

8. An integrated circuit ("IC") comprising:
a power supply signal;
an input signal; and
an input buffer powered by the power supply signal, the input buffer configured to reduce noise of the input signal by generating an output using multiple hysteresis windows, the input buffer comprising:
a Schmitt trigger circuit that includes transistors and control signals for adjusting an input low voltage and an input high voltage to establish one of the multiple hysteresis windows based on the input low voltage and the input high voltage, wherein at least a pair of the control signals is coupled with at least a pair of transistors to control only the power supply signal and at least another pair of the control signals is coupled with another pair of transistors to control only a ground, further wherein the control signals control corresponding transistors to establish the multiple hysteresis windows.

9. The circuit of claim 8 wherein each of the multiple hysteresis windows comprises a difference between the input high voltage and the input low voltage.

10. The circuit of claim 9 wherein the input high voltage comprises an input voltage threshold when an output switches from a low level to a high level and the input low voltage comprises an input voltage threshold when an output switches from a high level to a low level.

11. The circuit of claim 8 wherein the control signals that allow for a selection between the multiple hysteresis windows and the selection of the hysteresis window depends on a speed or noise of the input signal or source of the input signal.

12. The circuit of claim 8, wherein additional control signals coupled with additional transistors control only the power supply signal and further additional control signals coupled with further additional transistors control only the ground.

13. The circuit of claim 8 wherein a higher speed or lower noise input signal utilizes a smaller hysteresis level while a lower speed or higher noise input signal utilizes a larger hysteresis window.

14. A method comprising:
receiving an external input signal at an input buffer;
reducing input noise of the external input signal with a Schmitt trigger;
generating multiple levels of hysteresis in the Schmitt trigger that includes transistors and control signals by establishing multiple pairs of input high voltage and input low voltage;
wherein at least a pair of the control signals is coupled with at least a pair of the transistors to control only the power supply signal and at least another pair of the control signals is coupled with another pair of transistors to control only a ground, wherein the control signals control corresponding transistors to establish the multiple hysteresis windows, which include the difference in the input high voltage and input low voltage for one of the pairs, wherein the input high voltage and the input low voltage are adjustable.

15. The method of claim 14 further comprising:
identifying a speed or noise of the external input signal; and
selecting one of the hysteresis windows based on the identification, wherein a higher speed or lower noise external input signal utilizes a smaller hysteresis window while a lower speed or higher noise external input signal utilizes a larger hysteresis window.

16. A circuit with a Schmitt trigger comprising:
a plurality of pairs of input low voltage and input high voltage, wherein the input high voltage and the input low voltage are adjustable;
a plurality of control signals for selecting one or more of the pairs; and
a plurality of transistors;
wherein at least a pair of the control signals is coupled with at least a pair of the transistors to control only a power supply and at least another pair of the control signals is coupled with another pair of transistors to control only a ground;
wherein the selection of the control signals corresponds to a selection of both an input low voltage and an input high voltage to establish a hysteresis level, further wherein the control signals control corresponding transistors to establish the multiple hysteresis windows.

17. The circuit of claim 16 wherein each of the pairs of input low voltage and input high voltage correspond to a hysteresis level.

18. The circuit of claim 17 wherein the each of the hysteresis levels correspond with a window between the input low voltage and the input high voltage and each of the hysteresis levels has a different input low voltage and a different input high voltage.

19. The circuit of claim 17 wherein the selection of one of the pairs corresponds with selecting one of the hysteresis levels.

20. The circuit of claim 16 wherein the high input voltage comprises an input voltage threshold when an output switches from a low level to a high level and the low input voltage comprises an input voltage threshold when an output switches from a high level to a low level.

* * * * *